(12) United States Patent
Engberg (10) Patent No.: US 8,082,480 B2
(45) Date of Patent: Dec. 20, 2011

(54) DISTRIBUTED CHECKSUM COMPUTATION

(75) Inventor: Bjorn Engberg, Alton, NH (US)

(73) Assignee: Presagis, Montreal, Quebec (CA)

( * ) Notice: Subject to any disclaimer, the term of this patent is extended or adjusted under 35 U.S.C. 154(b) by 1210 days.

(21) Appl. No.: 11/823,849

(22) Filed: Jun. 27, 2007

(65) Prior Publication Data

US 2009/0006921 A1 Jan. 1, 2009

(51) Int. Cl.
*H03M 13/00* (2006.01)
(52) U.S. Cl. ........................................ 714/758
(58) Field of Classification Search .............. 714/746, 714/758, 787, 761–762
See application file for complete search history.

(56) References Cited

U.S. PATENT DOCUMENTS

| 5,345,451 | A | * | 9/1994 | Uriu et al. | 714/775 |
| 5,410,546 | A | * | 4/1995 | Boyer et al. | 714/763 |
| 5,878,057 | A | * | 3/1999 | Maa | 714/757 |
| 5,974,574 | A | * | 10/1999 | Lennie et al. | 714/52 |
| 7,139,963 | B1 | * | 11/2006 | Fox | 714/758 |
| 7,155,658 | B2 | * | 12/2006 | Huffman et al. | 714/776 |
| 7,631,251 | B2 | * | 12/2009 | Bower | 714/807 |

\* cited by examiner

*Primary Examiner* — Shelly A Chase
(74) *Attorney, Agent, or Firm* — FSP LLC (57) ABSTRACT

Data is divided into parts and each part provided to a different processor. Each processor processes the provided data part to produce a partial CRC result. The partial CRC results from each of the different processors are XORed to produce a CRC of the data.

11 Claims, 10 Drawing Sheets

DISTRIBUTED CHECKSUM COMPUTATION

TECHNICAL FIELD

The present disclosure relates to cyclic redundancy checks.

BACKGROUND

Cyclic redundancy checks (CRCs) are widely used in communication and data storage and processing environments. CRCs provide a check mechanism on the integrity of data. In particular, CRCs are useful for determining when errors take place in the communication of data (e.g. to and from storage systems, or between devices and/or components).

The computation of CRCs may be expensive in terms of computing resources, and thus it may be desirable to distribute the computation of CRCs across multiple processors. However, it has generally been inefficient to distribute computation of CRCs due to the nature of the calculations.

SUMMARY

The following summary is intended to highlight and introduce some aspects of the disclosed embodiments, but not to limit the scope of the claims. Thereafter, a detailed description of illustrated embodiments is presented, which will permit one skilled in the relevant art to make and use various embodiments.

Data may be divided into parts and each part provided to a different processor. Each processor may process a provided data part to produce a partial CRC result. The partial CRC results from each of the different processors may be XORed to produce a CRC of the data.

Producing a partial CRC result may include and/or involve XORing a plurality of CRCs of bit strings having one or more set bits, where each set bit of the bit strings corresponds to a set bit of the provided data part (e.g. corresponding to each "one" bit of the provided data part). Producing a partial CRC result may involve XOR multiplying the provided data part with the CRC of a string with a single bit set. Each processor may generate a CRC of upper bits of the result of the XOR multiply, and XOR the CRC of the upper bits with lower bits of the result of XOR multiply.

Each data part may include a string of bits, the string of bits including sequences of bits not representing data values (e.g. runs of zeros) separating portions of the string representing data values (i.e. zeros and ones representing meaningful data values). The single bit for which a CRC is taken for the XOR multiply may be set in a position that reflects the length of the sequence of bits (the non-data bits) separating the portions of the string of bits representing data values.

A CRC may be determined for the upper bits of the result of the XOR multiply, and this CRC of the upper bits may be XORed with lower bits of the result of the XOR multiply.

Together, these operations may be referred to as a "CRC forward" operation. Each processor may repeatedly apply a CRC forward operation to produce the partial CRC result.

In some implementations, each provided data part may include a plurality of pixel data (e.g. 32 bit pixels, or components thereof). In other implementations each data part may include a portion of a distributed data file.

Other system/method/apparatus aspects are described in the text (e.g., detailed description and claims) and drawings forming the present application.

BRIEF DESCRIPTION OF THE DRAWINGS

In the drawings, the same reference numbers and acronyms identify elements or acts with the same or similar functionality for ease of understanding and convenience. To easily identify the discussion of any particular element or act, the most significant digit or digits in a reference number refer to the figure number in which that element is first introduced.

DETAILED DESCRIPTION

Definitions

References to "one embodiment" or "an embodiment" do not necessarily refer to the same embodiment, although they may.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list.

"Logic" refers to signals and/or information that may be applied to influence the operation of a device. Software, hardware, and firmware are examples of logic. Hardware logic may be embodied in circuits. In general, logic may comprise combinations of software, hardware, and/or firmware.

Those skilled in the art will appreciate that logic may be distributed throughout one or more devices, and/or may be comprised of combinations of instructions in memory, processing capability, circuits, and so on. Therefore, in the interest of clarity and correctness logic may not always be distinctly illustrated in drawings of devices and systems, although it is inherently present therein.

An XOR is a binary operator which examines corresponding bits of two buffers and, if they are the same, sets the corresponding result bit to 0. If the two bits are not the same, the corresponding result bit is set to 1. For example:

| | |
|---|---|
| 0101 - | buffer 1 |
| 1100 - | buffer 2 |
| 1001 - | XOR result |

Thus, for the bitwise XOR of two binary strings, for each bit:

0 XOR 0=0;
0 XOR 1=1;
1 XOR 0=1;
1 XOR 1=0;

No borrows or carries are used when performing an XOR.

An XOR operation may also be performed on more than two buffers. The least significant bits of the buffers will be aligned, as before. The XOR operation works by examining the corresponding bits of the buffers. If the number of corresponding 1s is odd, the result bit will be a 1, otherwise, it is a 0. For example:

| | |
|---|---|
| 001001 - | buffer 1 |
| 010011 - | buffer 2 |
| 110001 - | buffer 3 |
| 101011 - | XOR result |

There also exists an inverse XOR operator where when the corresponding bits of the buffers are examined, if the number of corresponding 1s is odd, the result bit is a 0; otherwise, it is a 1.

The character ^ is often used to represent the XOR operator.

1^0^1=0;

1^1^1=1;

The shift operation is a binary operator operating on a single string. A bit string can be shifted left or right by appending or removing trailing zeros. For example, 1011 shifted left by 2 becomes 101100. Sometimes the trailing zeros are replaced by blanks for clarity. The operator << is often used to represent shift left; 1<<3=1000.

An XOR Multiply is a combination of the Shift and XOR of one binary string depending on the content of another binary string. The * symbol may be used to represent an XOR multiply. For example:

```
        101110
        110101  *
        -------------------------
        101110
       101110
      101110
     101110          ^
        ===============
     11110110110
```

An XOR Multiply with a value containing a single bit is the equivalent of a Shift. For example, 1011*100=1011<<2=101100.

CRC(1<<N) is the CRC of a buffer containing a single 1 followed by N zeros. For example, CRC(1<<3)=CRC(1000).

CRC Determination Using Simple XOR Operations

Figure 1:
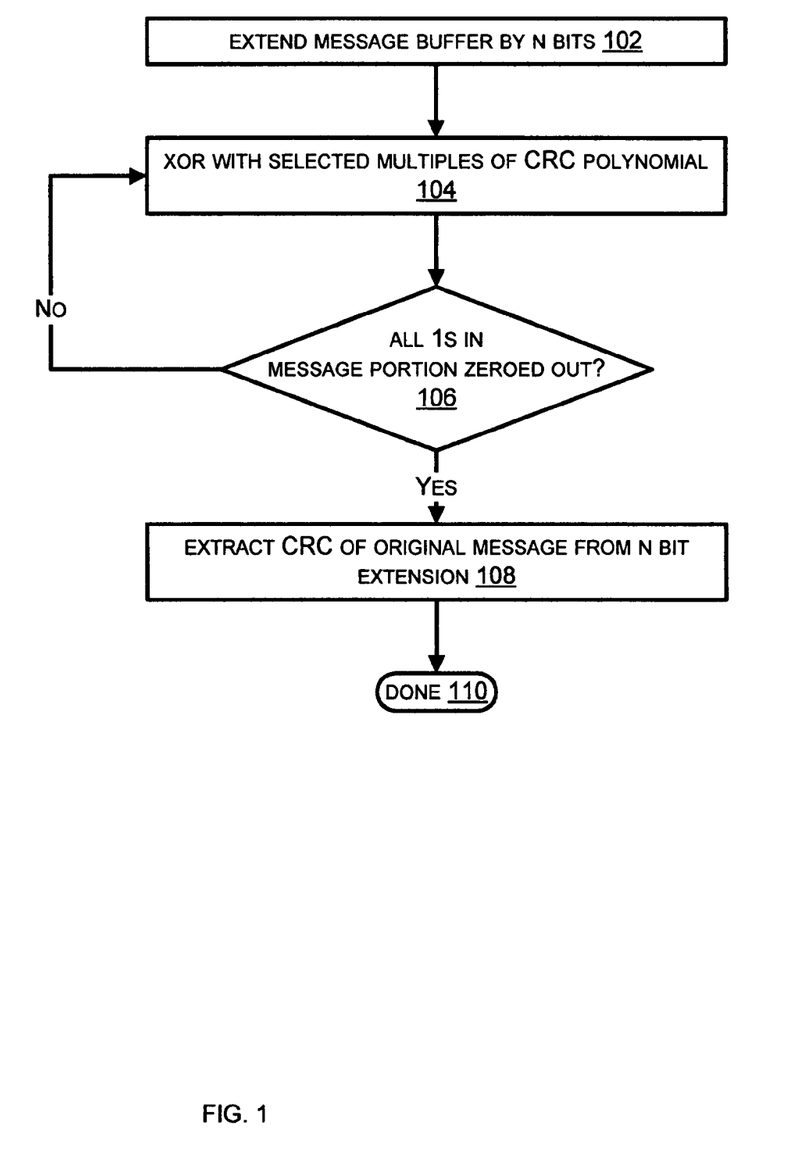
FIG. 1 is a flow chart of an embodiment of a CRC determination process using simple XOR operations.

FIG. 1 is a flow chart of an embodiment of a CRC determination process using simple XOR operations.

The CRC polynomial is M+1 bits and the CRC will, therefore, be M bits. At 102 the message buffer is extended by M bits. This may be accomplished by concatenating M bits set to 0 to the least significant bits of the message. The concatenation may occur by physically placing M 0s to the immediate right of the message buffer. In some alternate implementations, the extension may be assumed by the logic without actual modification of the message buffer. Throughout, the term "message buffer" refers to the data which is the object of the CRC calculation. This data may have been obtained as a communications message, may comprise image data, or may have any one of many other sources. Implementations may operate on a copy of the message buffer or transformed results may be placed into the message buffer. In some implementations, various partial results during the calculations may be held in non-contiguous volatile or permanent memory storage. Thus, in many implementations the original message buffer may not be modified.

In this description, the most significant bit of any buffer will be expressed as the leftmost bit with the least significant bit expressed as the rightmost bit. In the examples in this document, message buffers are processed from left to right, from the most significant bit to least significant bit. Of course, this need not be the case for all implementations.

Extending the message buffer by M least significant bits is the same as multiplying the message by (1<<M). For example, if the buffer contains the bit sequence 0101 it may be extended by M=2 to become 010100. In the examples that follow, particular buffer contents and the CRC polynomial are chosen for the discussion, but the procedures described herein are not limited thereto.

At 104, the extended message buffer is XORed with a selected multiple of the CRC polynomial.

Some implementations may also make use of an inverse XOR as well, in which odd numbers of corresponding 1s resulted in a 0 and even numbers of is resulted in a 1.

When the XOR of two message buffers is performed, the CRC of the combined result will be the XOR of the individual message buffer CRCs. If the two buffers are of different lengths, the rightmost bits of the buffers should be aligned prior to the XOR operation.

The CRC polynomial and any of its multiples have a CRC of 0 (when the CRC is calculated using the same polynomial). Therefore, the extended buffer may be XORed with another buffer (the multiple of the CRC polynomial) which has a CRC of 0. Whenever a buffer is XORed with another buffer with a CRC of 0, the CRC of the original buffer is unchanged. Therefore, the CRC of the result of the operation at 104 will be the CRC of the original buffer. The operation at 104 may be performed using a multiple of the CRC such that the most significant non-zero bit of the extended buffer is lined up the most significant bit of the CRC polynomial (which is always 1). For example:

11011—CRC polynomial of N+1=5 bits.

0111010001010000—original message buffer of 12 bits extended by N=4 bits.

The original message buffer is XORed with the CRC multiple resulting from aligning each buffer's most significant '1' bits.

| | |
|---|---|
| 0111010001010000 - | extended buffer |
| 0110110000000000 - | a multiple of the CRC polynomial |
| 0001100001010000 - | new contents of extended buffer. |

At 106, if the contents of the new buffer (i.e. excluding the N least significant bits created by extending the message)

contain a 1, the process is repeated. In the previous example from 104, this would first result in the new buffer being XORed as follows:

```
0001100001010000
0001101100000000 -     a multiple of the CRC polynomial
0000001101010000 -     new contents of extended buffer.
```

Each iteration of XORing as at 104 causes the most significant non-zero bit of the extended buffer to move right. Eventually, the last XOR operation will result in the extended buffer of N bits representing the CRC or the original message.
. . . after several XOR iterations at 104:
0000000000000110—the last four positions (i.e. the least significant N bits of the extended message) contain the CRC.

At 108, the CRC of the original message is extracted from the N extension bits. At 110, processing concludes.

Determining the CRC of a Message by Determining CRCs of Portions of the Message

Figure 2:
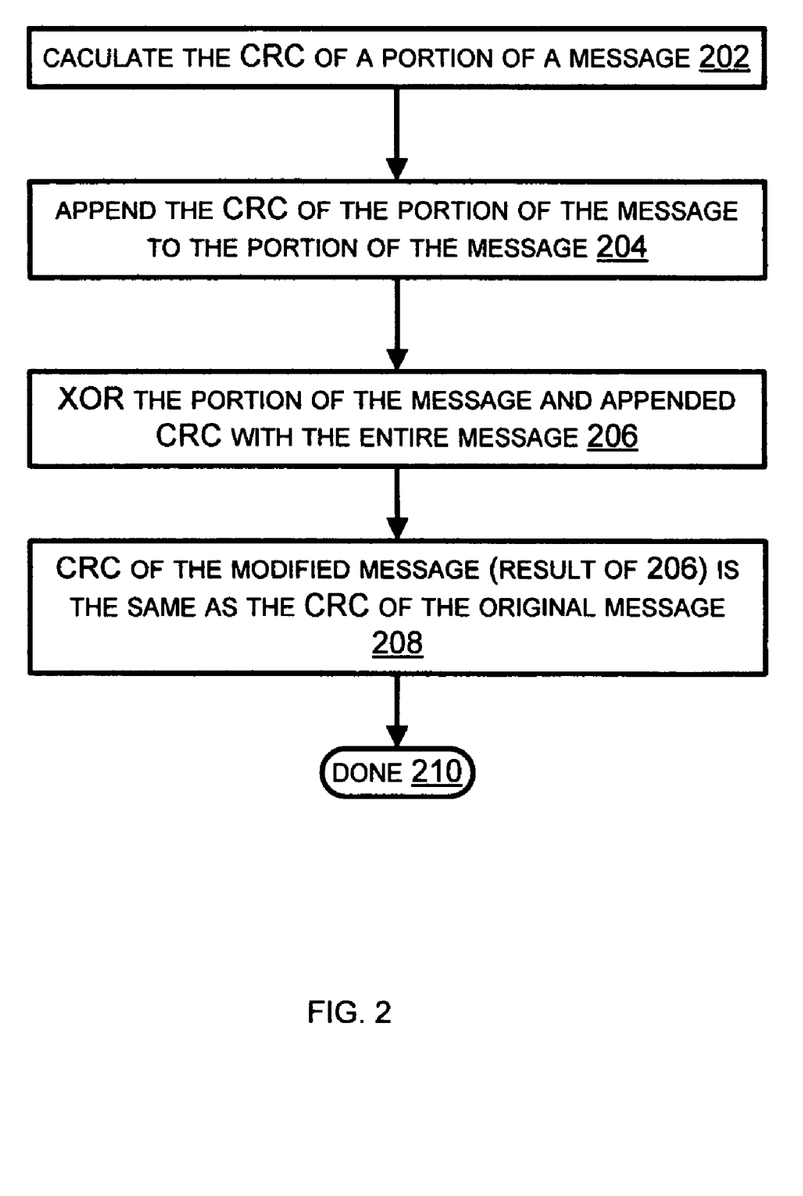
FIG. 2 is a flow chart of an embodiment of a process of determining the CRC of a message by determining CRCs of portions of the message.

FIG. 2 is a flow chart of an embodiment of a process of determining the CRC of a message by determining CRCs of portions of the message.

At 202, a portion of a message is selected from an entire message and its CRC is calculated. For example:

```
11011 -           CRC polynomial (5 bits)
011101000101 -    Original message (buffer 1)
011101 -          The most significant 6 bits of the message were selected.
1100 -            calculated CRC for selected message portion.
```

At 204, the CRC of the message portion is appended to the message portion. Using the previous example:
0111011100—message portion with its CRC appended (buffer 2)

Because any buffer with its CRC appended to it has a CRC of 0, such a buffer with appended CRC can be XORed with the original message without changing the CRC of the original message.

At 206, the message portion with CRC appended is XORed with the original message. To perform this XOR, the most significant bit of buffer 2 will be lined up with the most significant bit of the original message, buffer 1. If there is a length mismatch, the shorter buffer will have its least significant bits padded until both buffers in the XOR operation are of the same length. Because the message portion with CRC appended (buffer 2) has a CRC of 0, and XORing a buffer with another buffer of CRC 0 does not change the CRC of the original buffer, buffer 1. Using the previous example:

```
011101000101 -    Original message (buffer 1)
0111011100 -      message portion with its CRC appended (buffer 2)
000000110101 -    new contents of buffer 1.
```

Notice that the message portion which was selected at 202 from the original message had 12 bits, and the first 6 bits of the transformed contents of buffer 1 are now zeros. Because the bits of buffer 2 corresponding to the selected message portion were identical to those same bits in the original message, the operation described will always cause those bits in the XOR result to be zero. Therefore, the new contents created by following 202 through 206 could have been determined by selecting the message portion as before, calculating its CRC as before, then zeroing out the bits in the original buffer corresponding to the selected message portion, and XORing its CRC with the remaining portion of the message, lining up the most significant bit of the CRC with the most significant bit of the remaining part of the message. For example:

```
011101000101 -    Original message (buffer 1)
000000000101 -    message contents with selected portion bits zeroed
0000001100 -      CRC of selected message portion at the correct position.
000000110101 -    new contents of buffer 1.
```

Because buffer 1 was XORed with a buffer that had a CRC of zero, the CRC of the new contents of buffer 1 after the operation performed at 206 is the same as the CRC of the original message. At 210, processing concludes.

Figure 3:
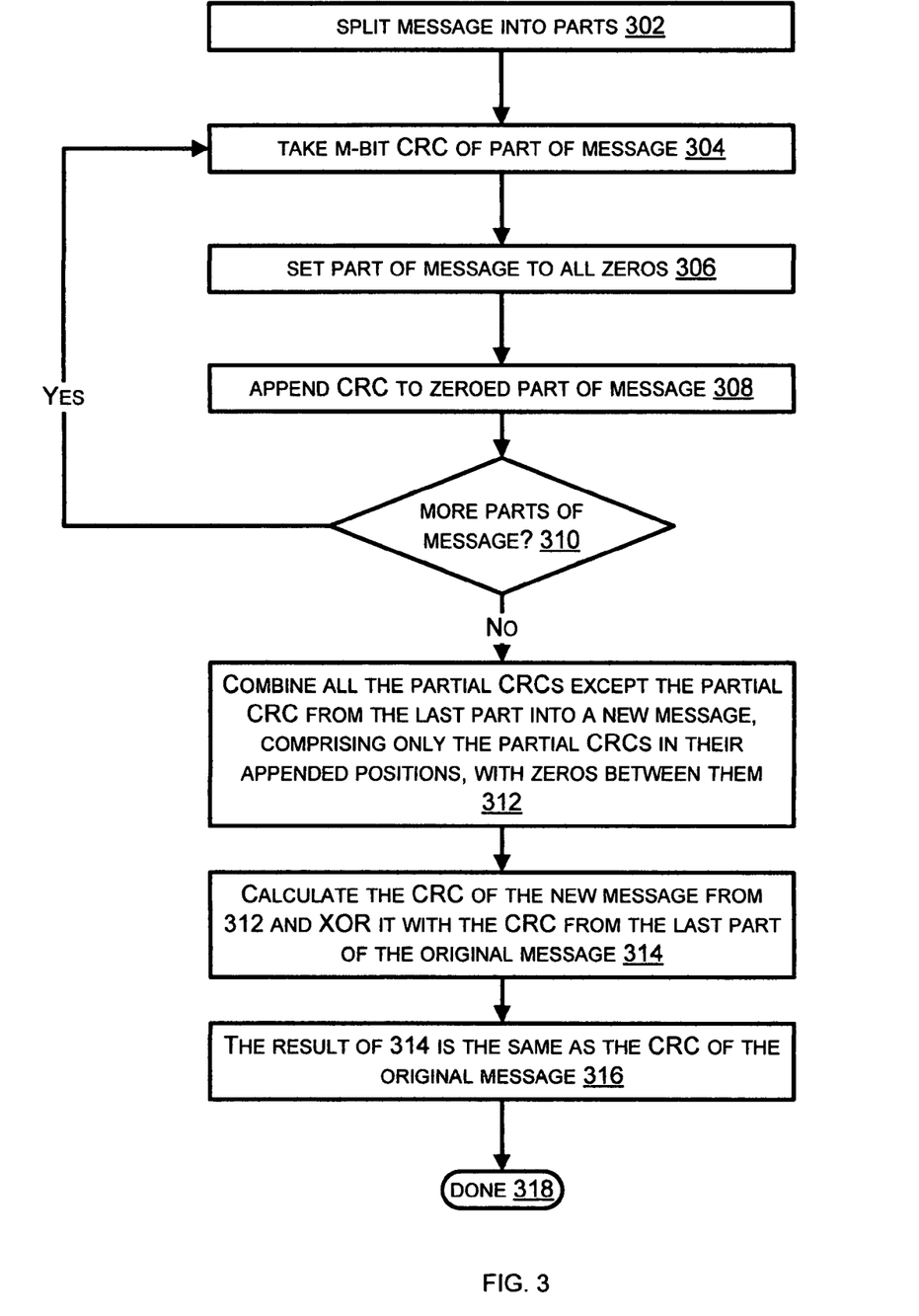
FIG. 3 is a flow chart of an embodiment of a process of determining the CRC of a message by determining CRCs of portions of the message.

FIG. 3 is a flow chart of an embodiment of a process of determining the CRC of a message by determining CRCs of portions of the message.

In FIG. 2, the transformation of buffer contents was described such that the CRC of the transformed contents remained the same, but the most significant bits of buffer contents wound up as zeroes. A message may also be split into multiple portions as a way of calculating its CRC. In FIG. 3, at 302 the message buffer is split into J=2 or more portions, which need not but may be of equal size. As was previously mentioned and is true throughout the discussion, when a message buffer is processed, such as "split", it may in fact remain unchanged but new buffers created for the results of processing, or logic set to recognize the changes without altering the buffer.

At 304, for some portion from 1 to J of the message, the M-bit CRC is calculated (implying that the CRC polynomial is M+1 bits.).

At 306, the message portion is zeroed.

At 308, the message portion (which is now all zeros) has the M bits of its CRC appended as least significant bits.

At 310, if there are more portions of the message needing transformation, the procedure returns to 304. When all portions of the message have been processed, the procedure proceeds to 312. Here is an example for a message buffer having 15 bits.

```
11011              CRC polynomial (5 bits)
00110001101011     Original message (CRC is 1011)
01110              portion 1
   10011           portion 2
      01011        portion 3
```

For each portion, a CRC is calculated, the message portion is zeroed, and the CRC is appended.

```
000001110              portion 1
   000000010           portion 2
      000000100        portion 3
```

At 312, these buffers with zeroed message portions and appended CRCs are lined up, so that the most significant bit of each buffer (after the first) line up with the most significant bit of the CRC of the preceding portion. The buffer portions are then XORed. Thus all the partial CRCs except the CRC from the last part are combined into a new message consisting only of the partial CRCs in their appended positions, with zeros between them. In the preceding example:

| | |
|---|---|
| 000001110 | portion 1 |
| 000000010 | portion 2 |
| 000000100 | portion 3 |
| 0000011100001000100 | XOR result buffer |

At 314, the CRC of the result buffer from 312 is calculated. It is then XORed with the CRC from the last part of the original message. In the example above, the CRC of the new message from the example in 312 is 1111.

| | |
|---|---|
| 1111 - | CRC of new message (from 312) |
| 0100 - | CRC of last part of original message (from 308) |
| 1011 - | Combined CRC, same as the CRC of the original message (316). |

At 316, the resulting CRC is the same as the CRC of the original message.

Figure 4:
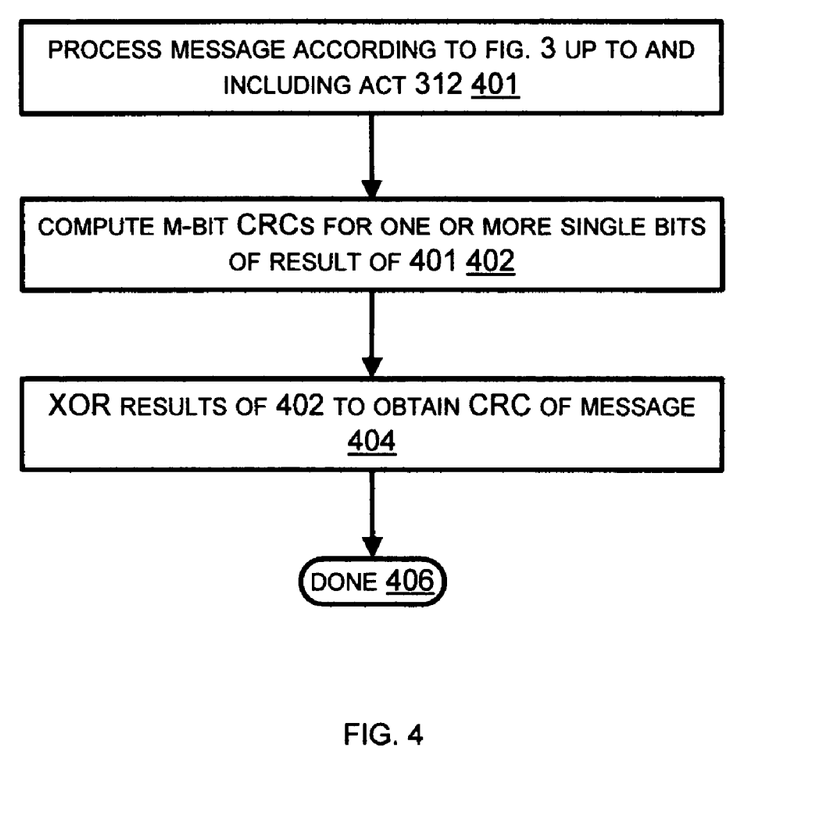
FIG. 4 is a flow chart of an embodiment of a process of determining the CRC of a message using the acts of FIG. 3 and CRCs of single bits of the message.

Determining the CRC of a Message Using the Acts of FIG. 3 and CRCs of Single Bits of the Message FIG. 4 is a flow chart of an embodiment of a process of determining the CRC of a message using the acts of FIG. 3 and CRCs of single bits of the message.

At 401, a message is split into portions. The message portions are then processed as is in FIG. 3 up to and including 312.

Message buffers in many applications may be much larger than the 16 bits used in the example in FIG. 3. The message buffer resulting from the processing of FIG. 3 may consist of long runs of zeros followed by (in the case of M bit CRCs) M bits that may be zeros or ones, followed by another run of zeros, and so on. Processing the result of FIG. 3 to calculate a final CRC of the original message may be quite processing intensive, and, therefore, take more time than desirable for some applications. One manner of reducing the processing involved is to use "single 1" buffer with an appended CRC. Recall that any message with the CRC of the message appended has a CRC of 0. The "single 1" buffer is XORed with the leading one of the buffer aligned with the leading 1 to eliminate from the message. Eliminating leading 1s within the message increases the number of leading zeros and thus reduces the processing involved to find the CRC of the message, because leading zeros may be ignored when finding the CRC of a message.

The following are some single 1 buffers and their CRCs, using an M=8 bit CRC.

The CRC polynomial is 101001101.

| | | |
|---|---|---|
| 0 | CRC | 00000000 |
| 1 | CRC | 01001101 |
| 10 | CRC | 10011010 |
| 100 | CRC | 01111001 |
| 100000000 | CRC | 11111000 |

Therefore, the following 1-bit buffers with appended CRC themselves have a CRC of 0:

101001101, 1010011010, and 10001111001.

Any multiple of a buffer with CRC of zero also has a CRC of 0. For example, 1010011010, 101001101000, 100011110010000, etc, which are multiples of the 1-bit buffers above with appended CRC, themselves all have CRCs of zero. Thus XORing any of these "single 1" buffers, or their multiples, with a message will result in a new message with the same CRC as the original. At 402, M bit CRCs are calculated for one or more of the 1 positions within the message. For example, using the CRC polynomial just presented:

| | | |
|---|---|---|
| 000000001011001000000000100011100000000.10000110 | | a 48 bit buffer created by the process of FIG. 3 |
| 100 . . . all zeros . . . | 01000101 | a single bit buffer with appended CRC |
| 100 . . . all zeros . . . | 01000010 | |
| 100 . . . all zeros . . . | 00100001 | |
| 100 . . . all zeros . . . | 10001011 | |
| 100 . . . zeros . . . | 00000011 | |
| 100 . . . | 01101110 | |
| 100 . . . | 00110111 | |
| 100 . . . | 10111101 | |
| XOR all CRCs | | |
| | 11001100 | |

Because calculating single bit CRCs may be computationally intensive, the single bit CRCs may be obtained in some implementations by performing a table lookup of pre-calculated values. At 404, the message resulting from FIG. 3 is XORed with the single bit buffers with appended CRCs corresponding to the 1s in the message to be eliminated. In the example above, the resulting buffer is 11001100, which is the CRC of the original 40 bit message.

As an alternative to a series of calculations of various "single 1" CRCs or use of a look-up table containing many values, one single pre-stored value may be used repeatedly. For example, when calculating the CRC of a message fragment such as 00000000100011100000000010000110 (a 32 bit buffer) the buffer 10000000011111001 may be used. As always, this single 1 buffer with 8 bit appended CRC has in totality a CRC of zero. Because multiples of this buffer such as 1000000001111100100 all also have CRC of 0, they also may be used in XOR operations with the message. In this example, the CRC polynomial remains 101001101.

| | |
|---|---|
| 00000000100011100000000010000110 | |
| 10000000111110010000000 | single 1 with appended CRC, shifted, CRC of total is 0 |
| 10000000011111001000 | single 1 with appended CRC, shifted, CRC of total is 0 |
| 10000000001111100100 | etc. |
| 100000000111110010 | etc. |
| 0111100111011000 | XOR result, this will have same CRC as the original buffer |

Although this operation has certainly reduced the size of the message to process, the result cannot be the CRC as there are too many bits in it. To obtain the CRC, the CRC of the excess bits (i.e. the bits to the left of the trailing M bits) is XORed with the trailing M bits. In the example, take 01111001 and use the CRC polynomial 101001101 to obtain its CRC, which is 00110111. This CRC is then XORed with the trailing M bits in the transformed buffer (here M=8) which are 11011000, resulting in a CRC of 01101111. This is the CRC of the original message.

The use of a "single 1" buffer with appended CRC, shifted and XORed with the message repeatedly to eliminate leading 1s of the message, then taking the CRC of the "excess" bits of the result and XORing this CRC with the remaining M trailing bits of a message is referred to herein as "CRC-forward".

Here is a second example of CRC forward, showing how its use may simplify calculation of the CRC of a message buffer fragment. The exemplary message buffer fragment 000000001011101100000000000000000000000000000000 has a calculated CRC of 00000110 using the CRC polynomial 101001101. The message has eight leading zeros, eight data bits, and then a long string of trailing zeros. The single-bit message 100000000000000000000000000000000, which corresponds to the rightmost (trailing) 1 bit in the message, has a CRC of 10001010. An XOR multiply is performed using the data portion of the buffer (10111011) and the CRC (10001010) of the selected one-bit message. The result is:

```
                                    10111011
        <XOR multiply>              10001010
                                   ----------
                                    10111011
                                   10111011
                                  10111011
                                  ===============
                                  101100100101110
```

The most significant bits beyond the M=8 least significant bits (where M is the length of the CRC) are 1011001. The CRC of 1011001 is calculated to be 00101000. When this CRC is XORed with the least significant M=8 bits (00101110), the result is the CRC of the original 48 bit fragment. The described series of operations in this second example comprises the "CRC forward" operation.

At 406, the process concludes.

Determining the CRC of a Message Using Acts of FIGS. 3 and 4

Figure 5:
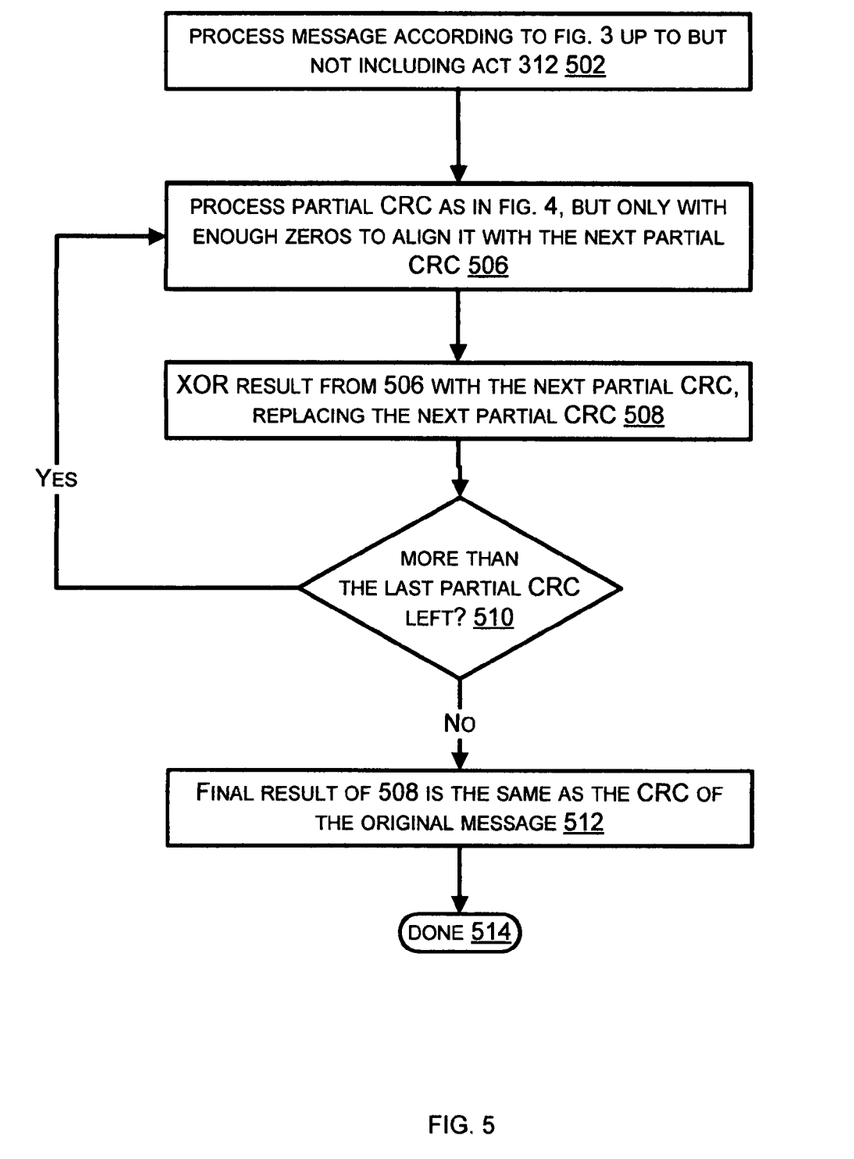
FIG. 5 is a flow chart of an embodiment of a process of determining the CRC of a message using acts of FIGS. 3 and 4.

FIG. 5 is a flow chart of an embodiment of a process of determining the CRC of a message using acts of FIGS. 3 and 4.

At 502, a message buffer is split into portions. Each portion has its CRC calculated and appended. The message portions are processed to produce a result in accordance with FIG. 3 up to but not including step 312.

At 506 the partial CRC of the most significant portion is processed according to FIG. 4. At 508 the result from 506 is overlapped with the higher M (M being the number of bits in the CRC) bits of the next most-significant portion of the buffer and the two are XORed. The result replaces the aforementioned next portion.

If at 510 it is found that more than the last message portion remains to be processed, processing returns to 506. When it is determined at 510 that all portions have been processed, at 512 the final result of 508 is the CRC of the original message. At 514 processing is completed.

For example, using the CRC polynomial 101001101 a message may be processed according to FIG. 3 to produce data portions separated by runs of non-data values (zeros):
00000000101100100000000010001110000000010000110

The resulting message has the same CRC as the original message. The resulting message may be split into three portions, in this case into:
Portion 1=0000000010110010
Portion 2=10001110
Portion 3=10000110

The leading zeros of portion 1 may be skipped as they do not affect the final results. Thus, portion 1 is 10110010. As described in 506, portion 1 is then processed using the CRC forward technique as per FIG. 4. In this example, the result is 10010111. This result is then overlapped with portion 2. Thus, the value 10010111 is overlapped with 10001110 and these are XORed, giving 00011001. A CRC forward of 00011001 yields 01001010. This value is XORed with portion 3, resulting in 11001100. This is the CRC of the original message.

"CRC Forward" Process

Figure 6:
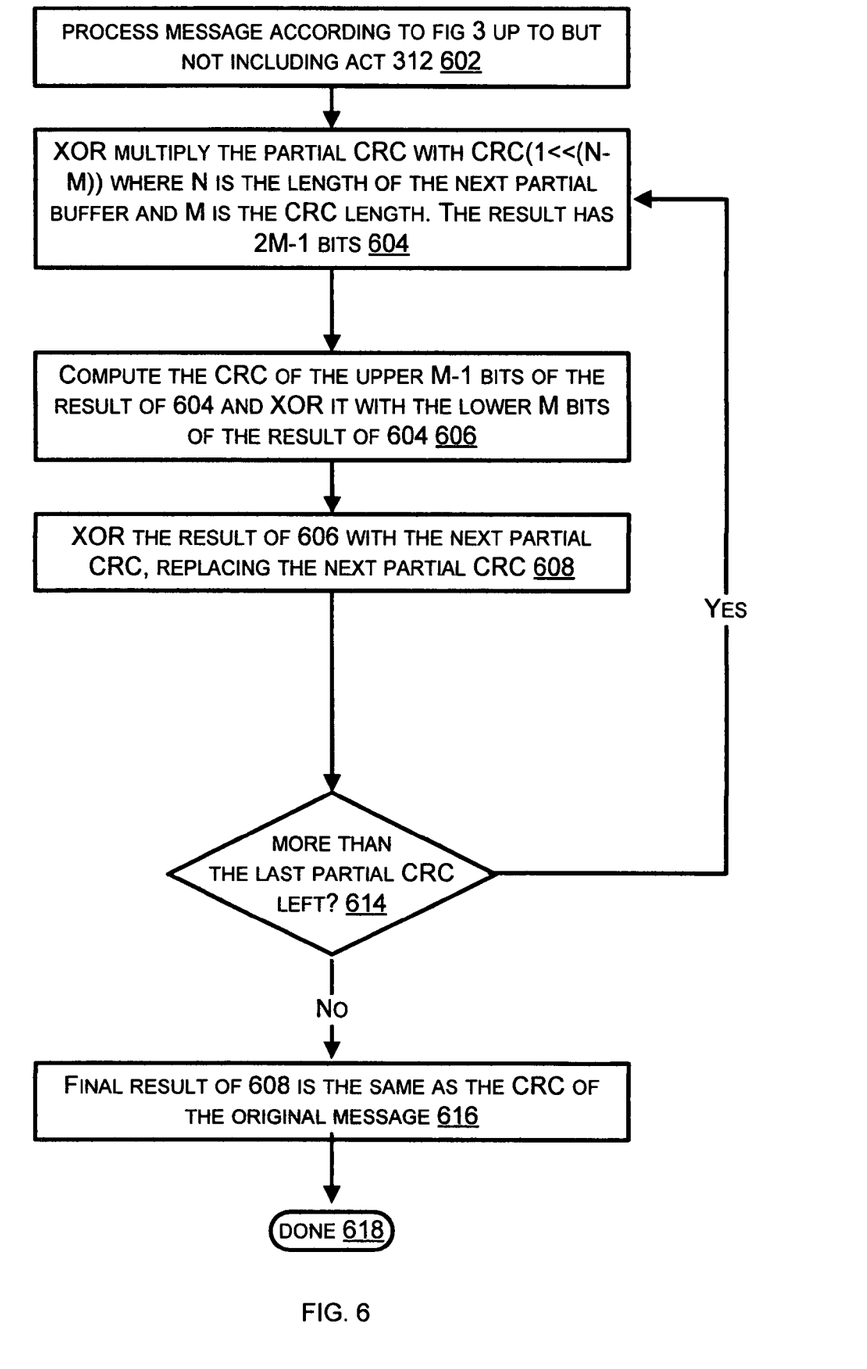
FIG. 6 is a flow chart of an embodiment of a "CRC forward" process.

FIG. 6 is a flow chart of an embodiment of a "CRC forward" process.

The order of acts may be changed somewhat without altering the final result. At 602, the message buffer is processed according to FIG. 3 up to but not including step 312. This results in a message comprising data portions with sequences of intervening zeros.

At 602, the new message is split into portions. The portions may be created according to the description of FIG. 3.

At 604, an XOR multiply is performed using the M-bit CRC of a single-1 buffer as described in FIG. 5. XOR multiply the portion with CRC(1<<(N−M)) where N is the length of the next portion and M is the CRC length. The result has 2M−1 bits.

At 606, the CRC of the upper M−1 bits of the result of 604 is computed and XORed with the lower M bits of the result of 604.

At 608, the result of 606 is XORed with the portion, replacing the next portion.

If more than the last portion is left as determined by 614, the result of 608 is processed according to 604.

If no more than the last portion is left, at 616 the final result of 608 is the CRC of the original message.

FIG. 6 illustrates one way in which the procedures described in FIGS. 3-5 may be varied to yield the same result, namely, the CRC of the original message. Not all such variations are described here but will be apparent to those skilled in the art in light of this description. The procedures described in FIGS. 3-6 are efficient ways to quickly calculate the CRC of message buffers using multiple processors. The calculations lend themselves to use with multiple processors as they proceed in parts.

CRC forward may be applied in many situations were CRCs are needed. For example, if data is spread across multiple machines and it is desired to calculate a combined CRC without copying all the data to one place to calculate a CRC, using CRC forward operations on each machine, the CRC of the combined data may be efficiently determined.

For frame buffers, multiple processors (such as graphics processors) may apply CRC forward to determine the CRC of the entire frame buffer.

Although not described here, those skilled in the art will recognize that CRC forward is compatible with well-known pre- and post processing techniques associated with CRC calculation.

Using CRC Forward to Find a CRC of a Sparse Message Buffer

Figure 7:
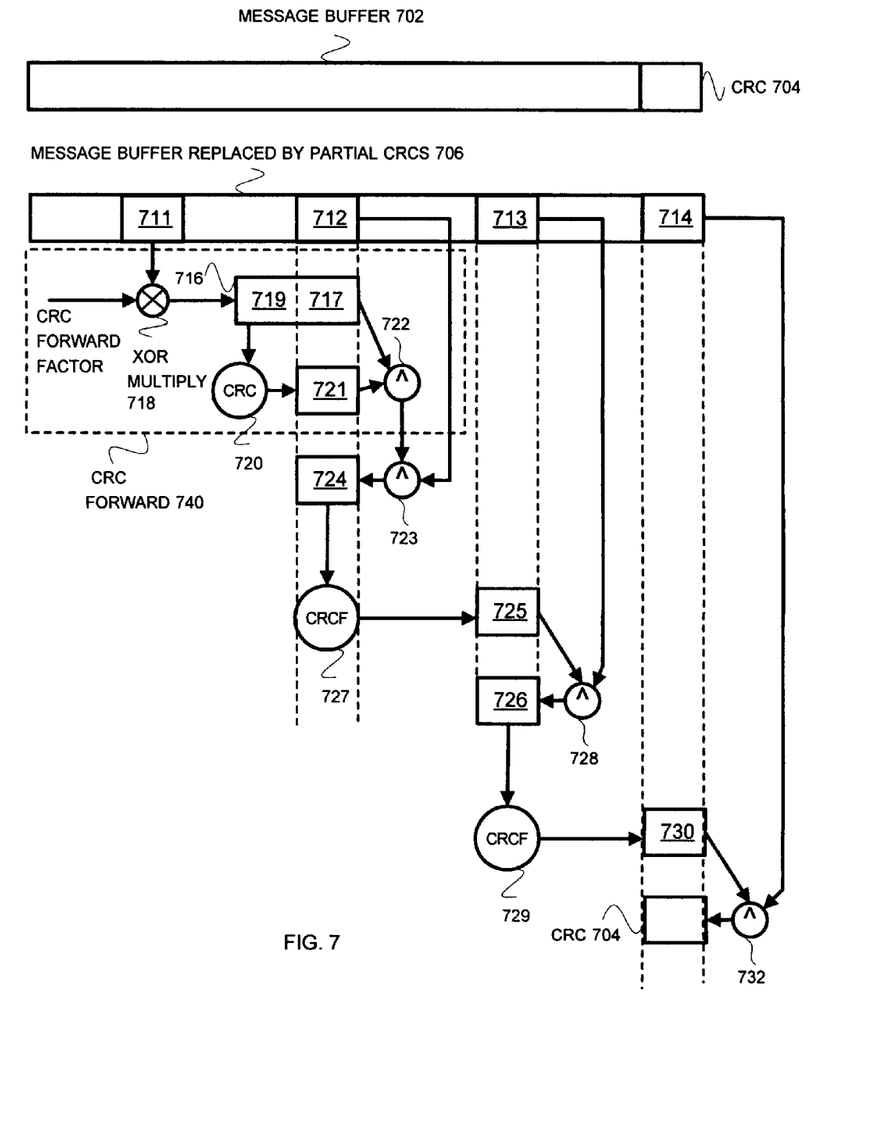
FIG. 7 is a block diagram of an embodiment of a process using CRC forward to find a CRC of a sparse message buffer.

FIG. 7 is a block diagram of an embodiment of a process using CRC forward to find a CRC of a sparse message buffer.

A message buffer copy 706 has had its message contents divided into data portions ("partial CRCs") and intervening runs of zeros replacing the original message, as described in FIG. 3. The data portions are 711, 712, 713, and 714.

The CRC forward procedure 740 is implemented with an input, initially the M bits of the portion 711 for the first message portion and a CRC forward factor (i.e. the CRC of a single-bit message). In 718, the two inputs are subject to an XOR multiply operation. The result of the XOR multiply 716 comprises M least significant bits 717 and excess bits 719. The excess bits 719 have their CRC calculated at 720 with result 721. The M least significant bits 717 are input along with the CRC 721 into an XOR operation 722. The output of 722 is the CRC forward 740 result.

The result of the CRC forward 740 is XORed at 723 with the next portion 712 with result 724. The result 724 is input to the CRC forward procedure at 727, along with the CRC forward factor (not shown). Note that the same CRC forward factor may be used in 727 as was used in 740, or a different one may be used. At 728 the result 725 is XORed with the next portion 713 with result 726. The result 726 is input to the CRC forward procedure 729 with result 730. Result 730 is XORed with the final data portion 714 of the message 706 with result 704. Result 704 is the CRC of the original message.

Using CRC Forward to Find a CRC of a Pixel Display Area

Figure 8:
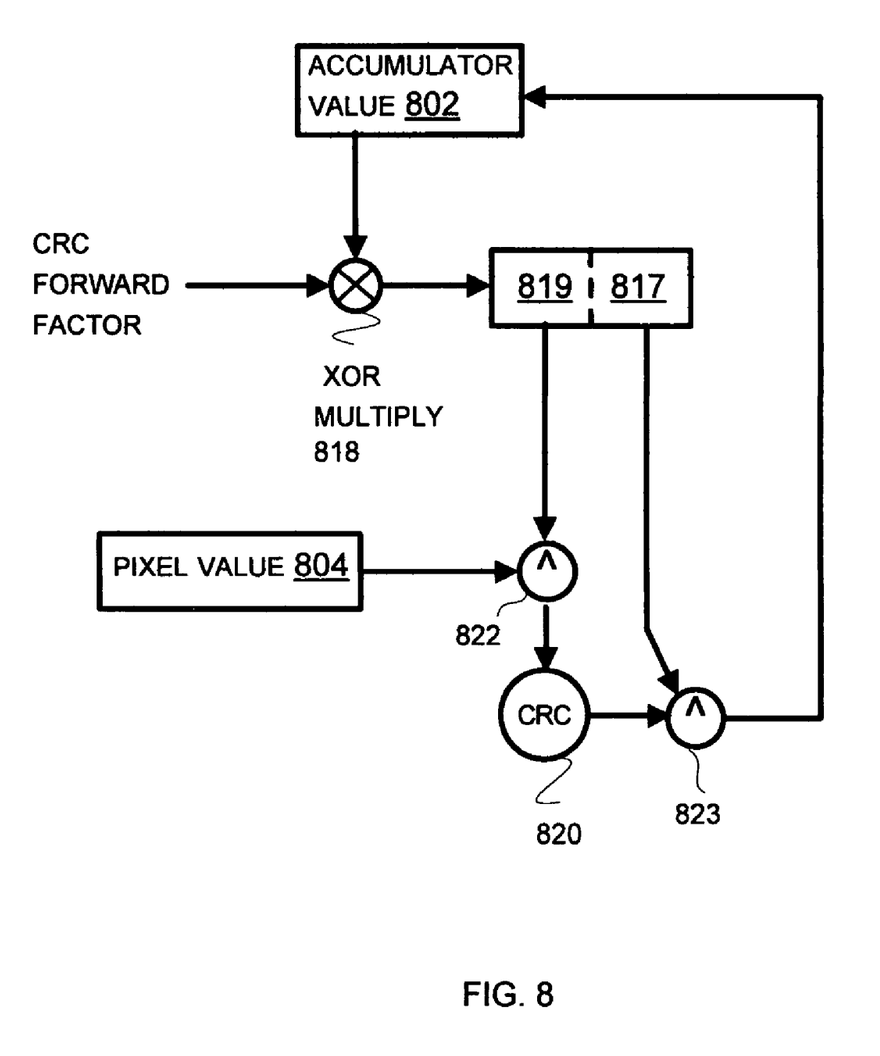
FIG. 8 is a block diagram of an embodiment of a process using CRC forward to find a CRC of a pixel display area.

FIG. 8 is a block diagram of an embodiment of a process using CRC forward to find a CRC of a buffer of pixels obtained from a camera or for a display.

Each processor of a multiprocessor video system may process certain pixels of the display, with the results ultimately combined to produce a final CRC for the pixel buffer. For example, let one part of the display buffer comprise pixels A B C D E F G H I J K L. In this example, there are four processors to be used to calculate the CRC. The original pixel buffer may be divided into four distinct buffers, as follows:

buffer1: A 0s 0s 0s E 0s 0s 0s I 0s 0s 0s,
buffer2: 0s B 0s 0s 0s F 0s 0s 0s J 0s 0s,
buffer3: 0s 0s C 0s 0s 0s G 0s 0s 0s K 0s,
buffer4: 0s 0s 0s D 0s 0s 0s H 0s 0s 0s L The pixel buffer is identical to the buffer1, buffer2, buffer3, and buffer4 XORed together. The pixel buffer CRC is identical to the buffer1 CRC, buffer2 CRC, buffer3 CRC, and buffer4 CRC XORed together. Each of four processors may process one of the buffers, using CRC forward to efficiently calculate a CRC for its particular buffer. These partial CRCs may be later combined to produce a final CRC for the pixel buffer. The CRC of full frame buffer will be the XOR of the CRCs for the individual, sparse sub-buffers.

FIG. 8 illustrates CRC calculation logic that may be implemented by individual processors, each acting independently of the others. A CRC-Forward operation comprises an XOR Multiply of the data with the chosen CRC forward factor. The CRC of the upper half ("excess bits") of that product is then calculated and XORed with the least significant M-bits, where M is the length of the CRC. In processing a resulting buffer (such as buffer 1), the XOR multiply will, as always, create results which are 2M−1 bits wide, where the upper M−1 consists of excess bits as previously discussed. The CRC forward factor may be chosen such that the least significant bit of the excess bits 819 will line up with the least significant bit of the pixel value 804 (pixel A for the first pass using the example) to be processed at the present iteration.

To minimize implemented logic, in many embodiments the accumulator value 802 may on the first pass be set to zero and at 818 the CRC operation will be applied. In those embodiments when the accumulator 802 is zero after application of the CRC-Forward 818 the result 819 817 will still be zero. The excess bits of the result 819 may be XORed at 822 and a CRC of the result taken at 820. The result of the CRC operation may be XORed 823 with the least significant bits 817, resulting in a new accumulator value 802. This operation may be performed repetitively on all pixel data in the sub-buffer being processed by a particular processor.

The prior example describes processing the left most pixel (A), then the next to the left (E), etc. However, those skilled in the art will recognize that the processing may be adapted to process the right most pixel (in the example, I), then the next to the right (E), etc. with similar results.

The pixels need not have the same number of bits as the resulting CRC. For example, the pixel may comprise 8, 16, 24, or 32 bits, or any other number of bits, with the CRC having 32 bits or any other number of bits. The CRC-Forward factor may be varied as the calculation repeats to account for a varying number of zeros between two pixels. This may occur for processing of certain pixel buffers as will be described in conjunction with FIG. 9.

Pixel Allocation to an 8×8 Processor Array

Figure 9:
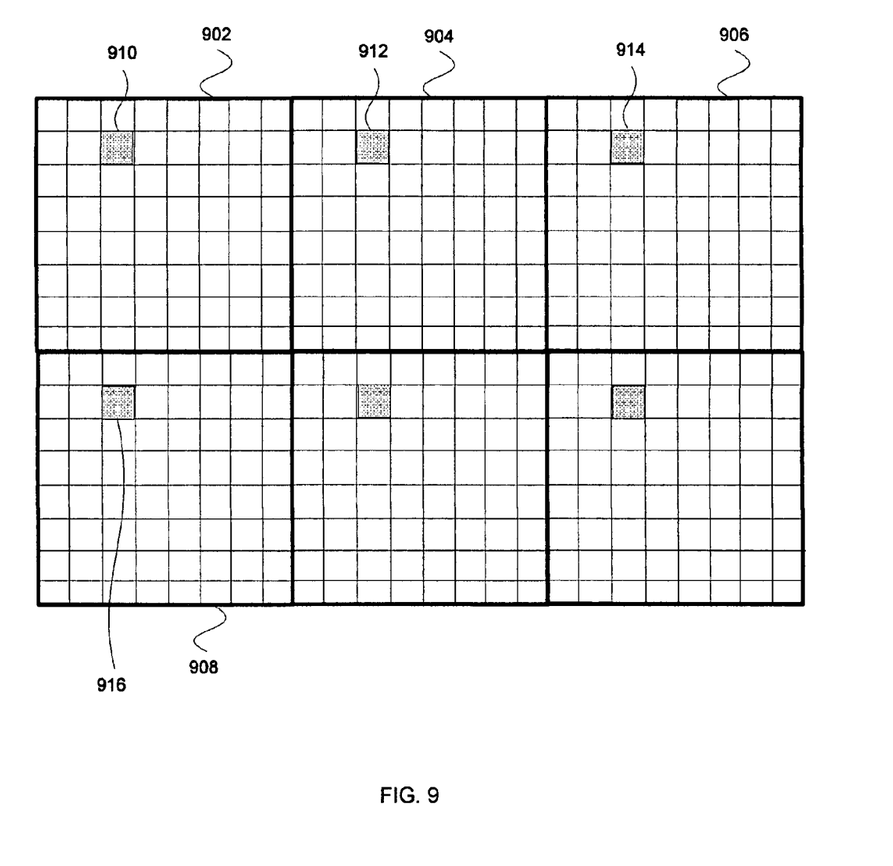
FIG. 9 is an illustration of an embodiment of a pixel allocation to an 8×8 processor array.

FIG. 9 is an illustration of an embodiment of a pixel allocation to an 8×8 processor array.

A video frame buffer comprising numerous pixel values is to be processed by multiple processing units to ultimately obtain a CRC of the full frame buffer. The frame buffer is divided into "tiles" 902, 904, 906, and 908. In this example, each tile comprises an 8×8 portion of pixel data. Each tile 902, 904, 906, or 908 has the characteristic that only one pixel within it will be processed by a particular processor. Thus, 64 processors will be involved in this example, each operating on pixels in different positions in the tile. Of course, this is only one possible allocation scheme, and others will be apparent to those skilled in the art.

For example, within tile 902 of pixel data, there is a pixel 910 which will be processed by one particular processor. This pixel is on row 2 (counting down from 1) and column 3 (counting left to right, from 1) within tile 902. Processor #11 of the 64 processor array may process this pixel data. Processor #11 may also process the pixel data in the same relative position as pixel 902 within the other tiles 902, 904, 906, and 908. Thus, processor #11 may operate on pixels 910, 912, 914, 916, etc. while treating the intervening pixels as non-data zeros.

Thus, processor #11 may operate on a (conceptual) buffer that looks like this:

0 0 (pixel 910) 0 0 0 0 0 0 0 (pixel 912) 0 0 0 0 0 0 0 (pixel 914)—175 0s—(pixel 916) etc.

Notice that between the first pixel 910 to be processed and the second pixel 912 there is a run of 7 intervening zeros (each zero having 32 zero-valued bits), corresponding to the seven pixels separating 910 and 912 in the frame buffer, these seven pixels being processed by processors other than processor #11. 910 and 912 are only 8 pixels apart, because the pixels are in adjacent tiles in a row of tiles. This is likewise the case between pixels 912 and 914. Thus, the CRC forward factor to use for pixels 912 and 914 would be CRC(1<<(32*8−M)), i.e. the CRC of a single-1 buffer, the single-1 buffer comprising a 1 followed by 32*8−M trailing zeros.

Pixels 914 and 916 are 176 pixels apart, because they are not only in different tiles, but also in different tile rows. The CRC forward factor to use when processing between these pixels is very different than the one used for pixels in the same tile row. In this case, the CRC forward factor to use is CRC (1<<(32*176−M)).

In this example, the tiles 902, 904, 906, and 908 each comprise 8 rows and 8 columns of pixels, so 64 processors may be used to calculate the CRC in parallel. The algorithm does not depend on the number of processors so more or fewer divisions into rows and columns may be performed depending on the application.

Post-Processing a CRC Calculation for a Pixel Display Area

Figure 10:
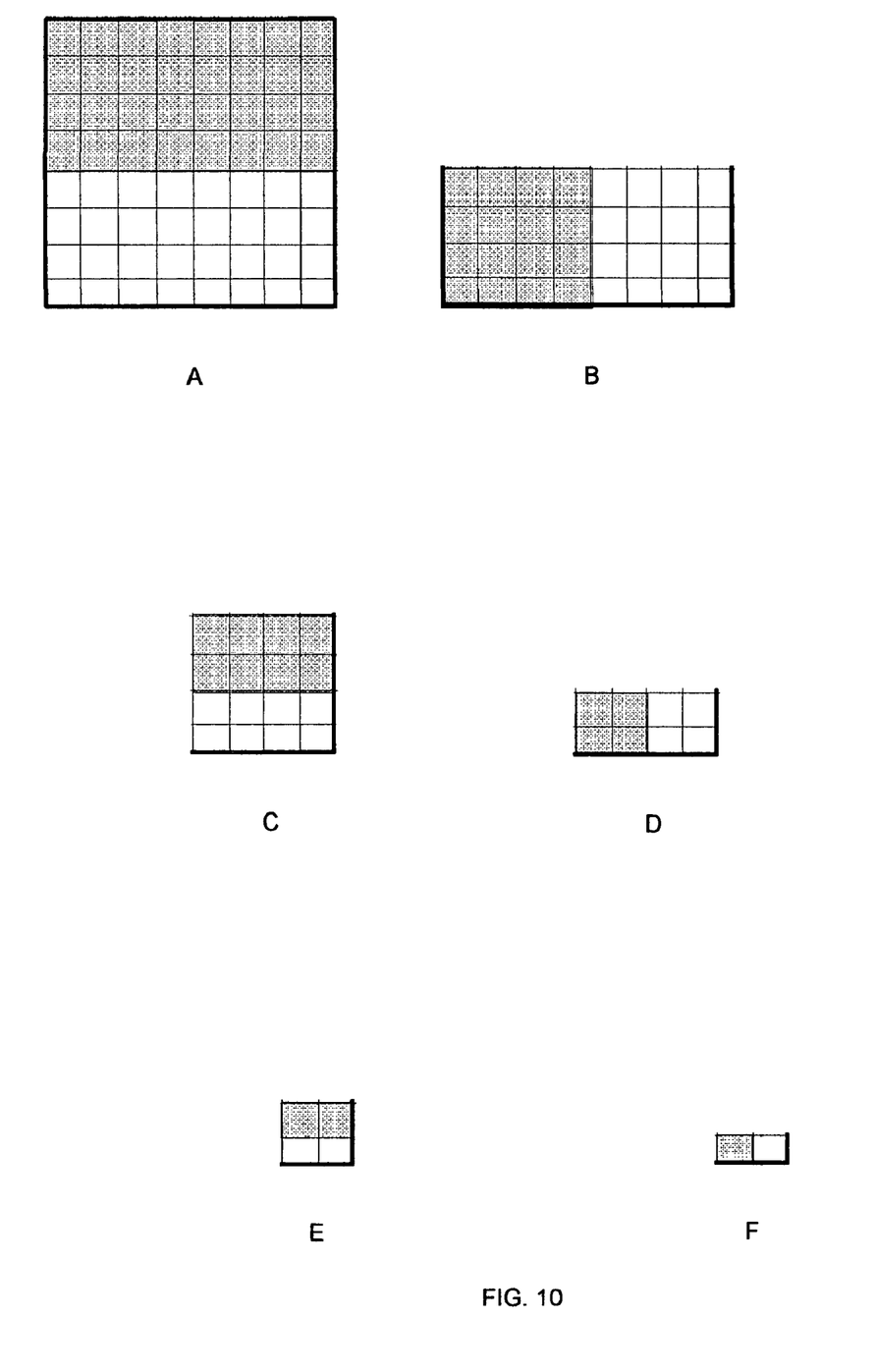
FIG. 10 is an illustration of an embodiment of post-processing by applying CRC-forwarding to blocks of processors in an 8×8 processor array for a pixel display area.

FIG. 10 is an illustration of an embodiment of a CRC forward process.

The results of using multiple processors (in the example, 64) in the example of FIG. 9 yields multiple (64) partial results. More generally, the result of use Z processors operating on tiles containing Z elements each to be processed by a particular processor will be Z partial results. These partial results are CRCs, but they comprise CRCs for data portions which cannot be XORed together as they do not line up. For the FIG. 9 example, processor #11 is partial CRC result may be considered to line up with row 2, column 3 CRC. The calculations performed in FIG. 9 did not forward that partial CRC over the 53 data positions to the right of it in the final tile. If processor #12 processed row 2, column 4 pixels, its partial CRC result will correspond to a CRC for position row 2, column 4, also not forwarded over 52 data positions to the right of it. Since the partial CRC results do not line up, they must be processed further prior to being combined. FIGS. 10 A-F illustrate how CRC forward operations may be performed on a tile to align all of the partial results within their respective buffers so that the partial results may be XORed together.

Using the example of the 64 processors handling data in the 8×8 tile, 32 processors may be given the CRC forward factor to forward a data square (corresponding to a partial CRC) by 32 positions. In FIG. 10-A, partial results in the upper four rows of the tile are CRC forwarded so that they align with the lower four rows of the tile. There are still 64 partial CRC results, but now two CRC results are "lined up" with each of the 32 positions in rows 5-8 (counting from 1) of the tile. Again using 32 processors and a CRC forward factor to "jump" by 4 positions, the leftmost four columns (which comprise 32 results) are then CRC forwarded to the rightmost four column positions. Thus the row 5, column 1 results (there are two of them) are each forwarded to row 5, column 5 etc. This process is repeated in binary fashion in 10C-F, until all of the processors comprise partial results in the same position. The partial results (in this case, 64 of them) may then be XORed together, either by a host processor, or one or more of the 64 display processors, to produce the final CRC value of the frame buffer.

Post-processing (e.g. XORing with a known value) may be applied to the final CRC value in some cases, in order to compensate for pre-processing of the message data, in manners well known in the art.

Multiplying CRC-Forward Factors

Calculating CRC-forward factors for large values of N can be time consuming. By performing a CRC-forward operation on a CRC-forward factor, the process can be accelerated. Given two CRC-Forward factors $F(N)=CRC(1<<(N-M))$ and $F(L)=CRC(1<<(L-M))$, XOR Multiply $F(N)$ and $F(L)$, calculate the CRC of the upper M−1 bits and XOR with the lower M bits, the result is the same as $F(N+L)=CRC(1<<(N+L-M))$.

Those having skill in the art will appreciate that there are various vehicles by which processes and/or systems described herein can be effected (e.g., hardware, software, and/or firmware), and that the preferred vehicle will vary with the context in which the processes are deployed. For example, if an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are several possible vehicles by which the processes described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations may involve optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood as notorious by those within the art that each function and/or operation within such block diagrams, flowcharts, or examples can be implemented, individually and/or collectively, by a wide range of hardware, software, firmware, or virtually any combination thereof. Several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory; and transmission type media such as digital and analog communication links using TDM or IP based communication links (e.g., packet links).

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment).

Those skilled in the art will recognize that it is common within the art to describe devices and/or processes in the fashion set forth herein, and thereafter use standard engineering practices to integrate such described devices and/or processes into larger systems. That is, at least a portion of the devices and/or processes described herein can be integrated into a network processing system via a reasonable amount of experimentation.

The foregoing described aspects depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

What is claimed is:

1. A method comprising:
    dividing data into parts and providing each part to a memory buffer of a different machine data processor, each data part comprising a string of bits, the string of bits comprising sequences of bits not representing data values separating portions of the string representing data values;
    each processor processing a provided data part to produce a partial CRC result; and
    xoring partial CRC results from each of the different processors to produce a CRC of the data.

2. The method of claim 1, wherein each processor processing a provided data part to produce a partial CRC result further comprises:
    xoring a plurality of CRCs of bit strings having one or more set bits, where each set bit of the bit strings corresponds to a set bit of the provided data part.

3. The method of claim 1, wherein each processor processing a provided data part to produce a partial CRC result further comprises:
    each processor XOR multiplying a CRC for a bit string having a single set bit with the provided data part.

4. The method of claim 3, wherein each processor XOR multiplying a CRC for a bit string having a single set bit with the provided data part further comprises:
    each processor generating a CRC of upper bits of the result of the XOR multiplying, and XORing the CRC of the upper bits with lower bits of the result of XOR multiplying.

5. The method of claim 3, wherein each processor XOR multiplying a CRC for a bit string having a single set bit with the provided data part further comprises:
    a position of the single set bit in the bit string varying according to a length of a sequence of bits not representing data values between portions of the data part representing data values.

6. The method of claim 1, wherein each data part comprising a string of bits, the string of bits comprising sequences of bits not representing data values separating portions of the string representing data values further comprises:
    each processor XOR multiplying a CRC for a bit string having a single set bit with the provided data part, where the single bit is set in a position that reflects the length of the sequence of bits separating the portions of the string of bits representing data values.

7. The method of claim 6, wherein each processor XOR multiplying a CRC for a bit string having a single set bit with the provided data part further comprises:
    each processor generating a CRC of upper bits of the result of the XOR multiplying, and XORing the CRC of the upper bits with lower bits of the result of XOR multiplying.

8. The method of claim 6, wherein each processor XOR multiplying a CRC for a bit string having a single set bit with the provided data part further comprises:
    a position of the single set bit in the bit string varying according to a length of a sequence of bits not representing data values between portions of the data part representing data values.

9. The method of claim 1, wherein each processor processing a provided data part to produce a partial CRC result further comprises:
    each provided data part comprising a plurality of pixel data.

10. The method of claim 1, wherein each processor processing a provided data part to produce a partial CRC result further comprises:
    each provided part comprising a portion of a distributed data file.

11. The method of claim 1, wherein each processor processing a provided data part to produce a partial CRC result further comprises:
    each processor repeatedly applying a CRC forward operation to produce the partial CRC result.

* * * * *